United States Patent
Watanabe et al.

(10) Patent No.: US 8,449,684 B2
(45) Date of Patent: *May 28, 2013

(54) SUBSTRATE CLEANING METHOD, SUBSTRATE CLEANING SYSTEM AND PROGRAM STORAGE MEDIUM

(75) Inventors: Tsukasa Watanabe, Nirasaki (JP); Naoki Shindo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1026 days.

This patent is subject to a terminal disclaimer.

(21) Appl. No.: 11/783,748

(22) Filed: Apr. 11, 2007

(65) Prior Publication Data

US 2007/0240736 A1    Oct. 18, 2007

(30) Foreign Application Priority Data

Apr. 13, 2006   (JP) .................... 2006-110957

(51) Int. Cl.
 *B08B 7/00*  (2006.01)
 *B08B 7/04*  (2006.01)
 *B08B 3/00*  (2006.01)

(52) U.S. Cl.
 USPC ............ 134/18; 134/1.3; 134/26; 134/34; 134/184; 134/902

(58) Field of Classification Search
 USPC ............ 134/184, 902, 1, 1.3, 34, 186, 18, 134/26, 32
 See application file for complete search history.

(56) References Cited

U.S. PATENT DOCUMENTS

| | | | |
|---|---|---|---|
| 5,505,785 A | 4/1996 | Ferrell | |
| 5,533,540 A | 7/1996 | Stanasolovich et al. | |
| 5,908,509 A * | 6/1999 | Olesen et al. | 134/1.3 |
| 6,039,055 A * | 3/2000 | Akatsu | 134/1.3 |
| 6,214,126 B1 * | 4/2001 | Miyoshi et al. | 134/2 |
| 6,254,688 B1 | 7/2001 | Kobayashi et al. | |
| 6,318,382 B1 | 11/2001 | Katagiri et al. | |

(Continued)

FOREIGN PATENT DOCUMENTS

| | | |
|---|---|---|
| JP | 8-39025 | 2/1996 |
| JP | 10-109072 | 4/1998 |
| JP | 2000-237704 | 9/2000 |
| JP | 2004-193329 | 7/2004 |

OTHER PUBLICATIONS

Japanese Office Action mailed on Oct. 15, 2010 for Japanese Application No. 2006-110957 with English translation.

*Primary Examiner* — Alexander Markoff

(74) *Attorney, Agent, or Firm* — Smith, Gambrell & Russell, LLP

(57) ABSTRACT

The present invention provides a substrate cleaning method capable of removing particles from the entire surface of a substrate to be processed at a high removing efficiency. In the substrate cleaning method according to the present invention, a substrate to be processed W is immersed in a cleaning liquid in a cleaning tank 12. Then, ultrasonic waves are generated in the cleaning liquid contained in the cleaning tank 12, so that the substrate W is subjected to an ultrasonic cleaning process. The step of generating ultrasonic waves includes a step of generating ultrasonic waves in the cleaning tank while the cleaning liquid is being supplied into the cleaning tank. A supply rate at which the cleaning liquid is supplied into the cleaning tank at a certain timing in the step of generating ultrasonic waves differs from a supply rate at which the cleaning liquid is supplied into the cleaning tank at another timing in the step of generating ultrasonic waves.

6 Claims, 5 Drawing Sheets

U.S. PATENT DOCUMENTS

| | | | |
|---|---|---|---|
| 6,372,051 B1 * | 4/2002 | Adams et al. | 134/18 |
| 7,111,632 B2 * | 9/2006 | Berman et al. | 134/184 |
| 2003/0106566 A1 | 6/2003 | Danese et al. | |
| 2004/0112410 A1 | 6/2004 | Araki et al. | |
| 2005/0061355 A1 * | 3/2005 | Berman et al. | 134/1.3 |
| 2005/0121051 A1 | 6/2005 | Okano et al. | |
| 2006/0021439 A1 | 2/2006 | Kerr et al. | |
| 2007/0215172 A1 * | 9/2007 | Watanabe et al. | 134/1 |

* cited by examiner

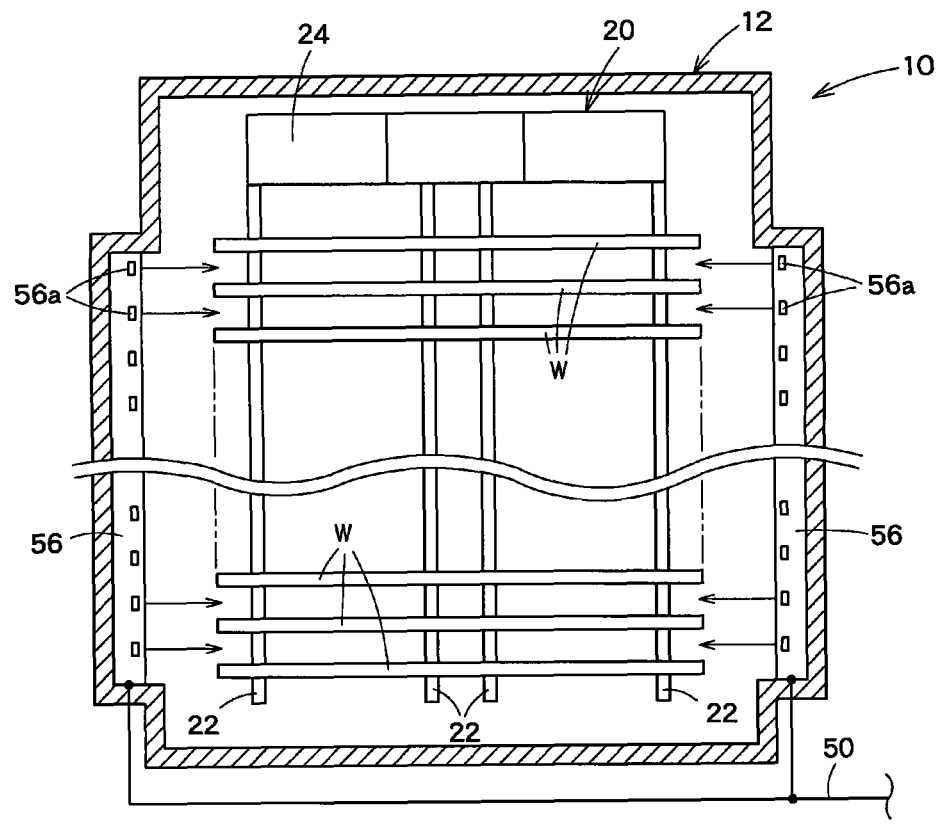
F I G. 2
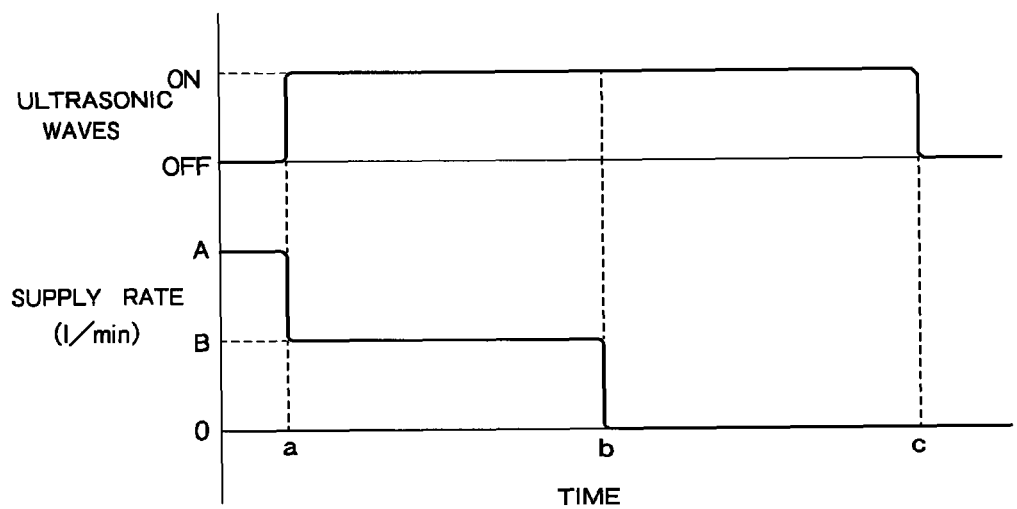
F I G. 3

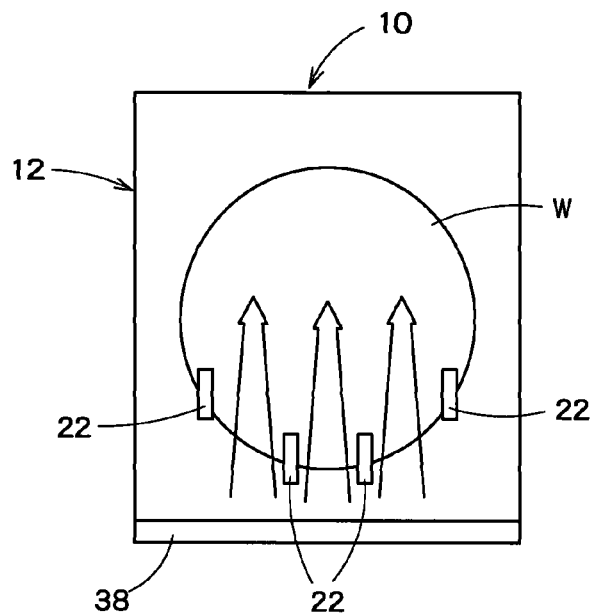
F I G. 4
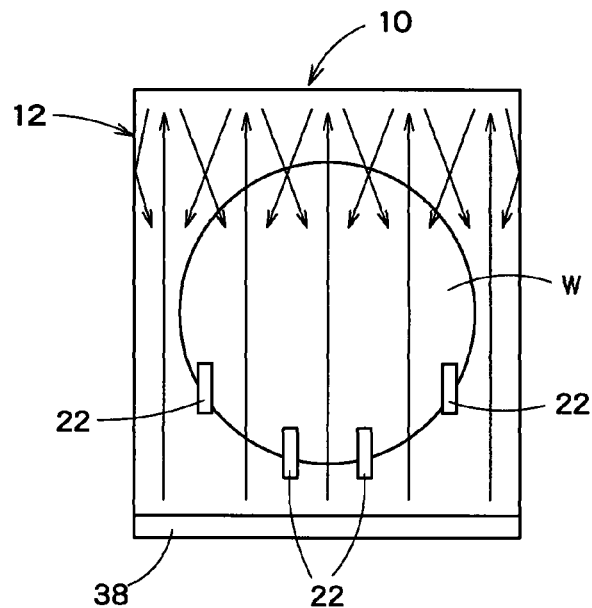
F I G. 5

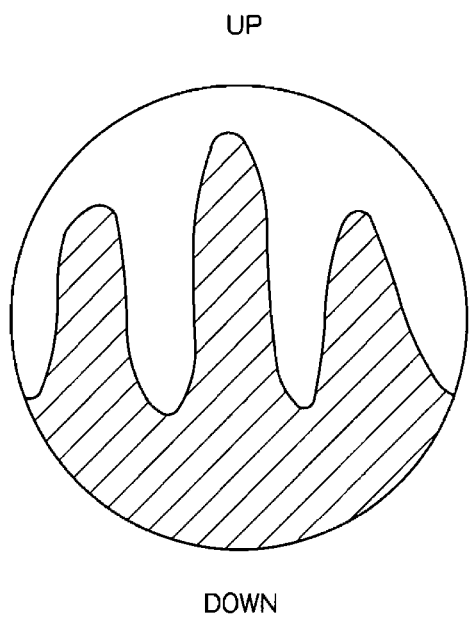
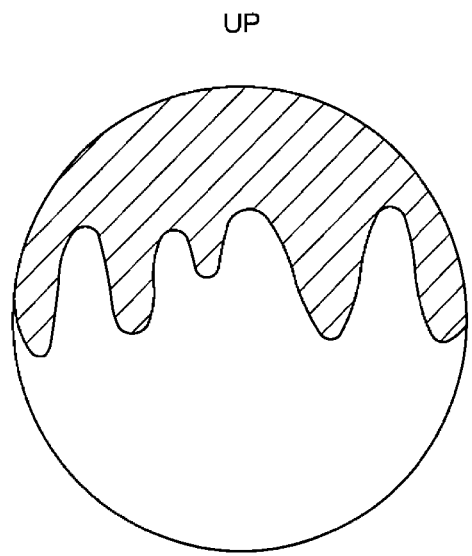
F I G. 7A — CLEANING LIQUID SUPPLIED
F I G. 7B — NO CLEANING LIQUID SUPPLIED

SUBSTRATE CLEANING METHOD, SUBSTRATE CLEANING SYSTEM AND PROGRAM STORAGE MEDIUM

CROSS REFERENCE TO RELATED APPLICATIONS

This application is based upon and claims the benefit of priority from the prior Japanese Patent Application No. 2006-110957 filed on Apr. 13, 2006, the entire contents of which are incorporated herein by reference.

BACKGROUND OF THE INVENTION

1. Field of the Invention

The present invention relates to a substrate cleaning method and a substrate cleaning system for removing particles (foreign matters) adhering to a substrate to be processed by immersing the substrate to be processed in a cleaning liquid and generating ultrasonic waves in the cleaning liquid. More particularly, the present invention relates to a substrate cleaning method and a substrate cleaning system capable of removing particles from the entire surface of a substrate to be processed at a high removing efficiency.

The present invention relates also to a program storage medium storing a program for accomplishing a substrate cleaning method capable of removing particles from the entire surface of a substrate to be processed at a high removing efficiency.

2. Description of the Related Art

There is known, from JP10-109072A, for example, a cleaning method, which cleans a substrate to be processed by immersing the substrate held by a holding member in a cleaning liquid and by generating ultrasonic waves in the cleaning liquid. This cleaning method is generally called an ultrasonic cleaning process, and also called a megasonic cleaning process. JP10-109072A describes that, in order to clean a substrate to be processed at a high particle removing efficiency, it is effective to set a dissolved gas concentration of a gas dissolved in a cleaning liquid within a predetermined range.

SUMMARY OF THE INVENTION

Generally, ultrasonic waves are radiated from below a substrate to be processed. Therefore, there is a possibility that particle removing efficiency in a part of the substrate is different from that in another part of the substrate. In particular, because of a holding member holding the substrate from below which may interfere with the radiation of the ultrasonic waves, there is a possibility that some areas in the substrate are cleaned at a lower particle removing efficiency.

The present invention has been made in view of such a problem and it is therefore an object of the present invention to provide a substrate cleaning method and a substrate cleaning system capable of uniformly removing particles from the surface of a substrate to be processed at a high removing efficiency. In addition, it is more preferable that a substrate to be processed is cleaned by the substrate cleaning method and the substrate cleaning system with a simple control.

Another object of the present invention is to provide a program storage medium storing a program for accomplishing a substrate cleaning method capable of uniformly removing particles from the entire surface of a substrate to be processed at a high removing efficiency.

The inventors of the present invention prosecuted extensive studies regarding how a distribution of a particle removing efficiency of a single substrate to be processed, which was cleaned in a cleaning liquid by an ultrasonic cleaning process, differs between a case in which a cleaning liquid was supplied into a cleaning tank during when ultrasonic waves were generated in the cleaning liquid contained in the cleaning tank, and a case in which no cleaning liquid was supplied into a cleaning tank during when ultrasonic waves were generated in the cleaning liquid contained in the cleaning tank. Then, the inventors found that a position of an area where particles are easily removed changes in the substrate, depending on whether the cleaning liquid is supplied or not into the cleaning tank during when ultrasonic waves are generated in the cleaning liquid contained in the cleaning tank, and depending further on the increase or decrease in a supply rate of the cleaning liquid supplied into the cleaning tank during when ultrasonic waves are generated in the cleaning liquid contained in the cleaning tank. The present invention is on the basis of this research.

The substrate cleaning method according to the present invention comprises the steps of: immersing a substrate in a cleaning liquid in a cleaning tank; and generating ultrasonic waves in the cleaning liquid contained in the cleaning tank; wherein the step of generating ultrasonic waves includes a step of generating ultrasonic waves in the cleaning liquid contained in the cleaning tank while the cleaning liquid is being supplied into the cleaning tank, and a supply rate at which the cleaning liquid is supplied into the cleaning tank at a certain timing in the step of generating ultrasonic waves differs from a supply rate at which the cleaning liquid is supplied into the cleaning tank at another timing in the step of generating ultrasonic waves.

According to the substrate cleaning method of the present invention, particles can be uniformly removed from a substrate. At the same time, a particle removing efficiency can be improved in the substrate from the overall point of view. In the substrate cleaning method, the cleaning liquid may be continuously supplied throughout the period in which ultrasonic waves are generated. Alternatively, the cleaning liquid may be temporarily supplied during the period in which ultrasonic waves are generated.

In the substrate cleaning method according to the present invention, the step of generating ultrasonic waves may further include a step of generating ultrasonic waves in the cleaning liquid contained in the cleaning tank while the supply of the cleaning liquid is stopped. In the step of generating ultrasonic waves, the step of generating ultrasonic waves in the cleaning liquid contained in the cleaning tank while the cleaning liquid is being supplied into the cleaning tank, and the step of generating ultrasonic waves in the cleaning liquid contained in the cleaning tank while the supply of the cleaning liquid is stopped may be carried out once or more times, respectively.

In the step of generating ultrasonic waves in the cleaning liquid contained in the cleaning tank while the cleaning liquid is being supplied into the cleaning tank, a supply rate at which the cleaning liquid is supplied into the cleaning tank may be changed in a stepwise manner or stepless manner. According to the substrate cleaning method of the present invention, particles can be more uniformly removed from a substrate. At the same time, a particle removing efficiency can be more improved in the substrate from the overall point of view. Alternatively, in the step of generating ultrasonic waves in the cleaning liquid contained in the cleaning tank while the cleaning liquid is being supplied into the cleaning tank, a supply rate at which the cleaning liquid is supplied into the cleaning tank may be maintained constant.

Further, the step of generating ultrasonic waves in the cleaning liquid contained in the cleaning tank while the supply of the cleaning liquid is stopped may be carried out after the step of generating ultrasonic waves in the cleaning liquid contained in the cleaning tank while the cleaning liquid is being supplied into the cleaning tank.

Further, in the step of generating ultrasonic waves, a supply rate at which the cleaning liquid is supplied into the cleaning tank may be changed in a stepwise manner or stepless manner.

A substrate cleaning system according to the present invention comprises: a cleaning tank that contains a cleaning liquid; an ultrasonic generator that generates ultrasonic waves in the cleaning liquid contained in the cleaning tank; a cleaning liquid supply system that supplies the cleaning liquid into the cleaning tank; and a control device that controls the supply of the cleaning liquid by the cleaning liquid supply system and the generation of ultrasonic waves by the ultrasonic generator in the cleaning liquid contained in the cleaning tank; wherein the control device controls the supply of the cleaning liquid and the generation of ultrasonic waves in such a manner that: the cleaning liquid is supplied into the cleaning tank for at least a certain period of time during when ultrasonic waves are generated in the cleaning liquid contained in the cleaning tank; and that a supply rate at which the cleaning liquid is supplied into the cleaning tank at a certain timing during when ultrasonic waves are generated in the cleaning liquid contained in the cleaning tank differs from a supply rate at which the cleaning liquid is supplied into the cleaning tank at another timing during when ultrasonic waves are generated in the cleaning liquid contained in the cleaning tank.

According to the substrate cleaning system of the present invention, particles can be uniformly removed from a substrate. In addition, a particle removing efficiency can be improved in the substrate from the overall point of view. In the substrate cleaning system, the cleaning liquid may be continuously supplied throughout the period in which ultrasonic waves are generated. Alternatively, the cleaning liquid may be temporarily supplied during the period in which ultrasonic waves are generated.

In the substrate cleaning system according to the present invention, the control device may control the supply of the cleaning liquid and the generation of ultrasonic waves in such a manner that the supply of the cleaning liquid into the cleaning tank is stopped for another period of time other than the certain period of time during when ultrasonic waves are generated in the cleaning liquid contained in the cleaning tank. During when ultrasonic waves are generated, there may be one or more period(s) of time in which the cleaning liquid is supplied into the cleaning tank, and one or more period(s) of time in which the supply of the cleaning liquid into the cleaning tank is stopped.

In the substrate cleaning system, in the certain period of time in which the cleaning liquid is supplied into the cleaning tank, the control device may control the supply of the cleaning liquid and the generation of ultrasonic waves in such a manner that a supply rate at which the cleaning liquid is supplied into the cleaning tank is changed in a stepwise manner or stepless manner. According to the substrate cleaning system of the present invention, particles can be more uniformly removed from a substrate. At the same time, a particle removing efficiency can be more improved in the substrate from the overall point of view. Alternatively, in the substrate cleaning system, in the certain period of time in which the cleaning liquid is supplied into the cleaning tank, the control device may control the supply of the cleaning liquid and the generation of ultrasonic waves in such a manner that a supply rate at which the cleaning liquid is supplied into the cleaning tank is maintained constant.

Further, in the substrate cleaning system, during when ultrasonic waves are generated, the control device may control the supply of the cleaning liquid and the generation of ultrasonic waves in such a manner that the cleaning liquid is supplied into the cleaning tank at first, and then the supply of the cleaning liquid into the cleaning tank is stopped.

Further, in the substrate cleaning system, during when ultrasonic waves are generated, the control device may control the supply of the cleaning liquid and the generation of ultrasonic waves in such a manner that a supply rate at which the cleaning liquid is supplied into the cleaning tank is changed in a stepwise manner or stepless manner.

A program storage medium according to the present invention is a storage medium storing a program executed by a control device for controlling a substrate cleaning system so as to accomplish a substrate cleaning method comprising the steps of: immersing a substrate in a cleaning liquid in a cleaning tank; and generating ultrasonic waves in the cleaning liquid contained in the cleaning tank; wherein the step of generating ultrasonic waves includes a step of generating ultrasonic waves in the cleaning liquid contained in the cleaning tank while the cleaning liquid is being supplied into the cleaning tank, and a supply rate at which the cleaning liquid is supplied into the cleaning tank at a certain timing in the step of generating ultrasonic waves differs from a supply rate at which the cleaning liquid is supplied into the cleaning tank at another timing in the step of generating ultrasonic waves.

A program according to the present invention is a program executed by a control device for controlling a substrate cleaning system so as to accomplish a substrate cleaning method comprising the steps of: immersing a substrate in a cleaning liquid in a cleaning tank; and generating ultrasonic waves in the cleaning liquid contained in the cleaning tank; wherein the step of generating ultrasonic waves includes a step of generating ultrasonic waves in the cleaning liquid contained in the cleaning tank while the cleaning liquid is being supplied into the cleaning tank, and a supply rate at which the cleaning liquid is supplied into the cleaning tank at a certain timing in the step of generating ultrasonic waves differs from a supply rate at which the cleaning liquid is supplied into the cleaning tank at another timing in the step of generating ultrasonic waves.

BRIEF DESCRIPTION OF THE DRAWINGS

FIG. 2 is a cross-sectional view taken on the line II-II in FIG. 1;

FIG. 3 is a diagram for explaining a change in a supply rate at which a cleaning liquid is supplied from a cleaning liquid supply system in connection with an operating mode of an ultrasonic generator;

FIG. 4 is a view for explaining a mode of propagation of ultrasonic waves in the cleaning liquid;

FIG. 5 is a view for explaining a mode of propagation of ultrasonic waves in the cleaning liquid;

FIG. 7 is a view for explaining a relation between the supply of the cleaning liquid or lack thereof from the cleaning liquid supply system, and an area with a high particle removing efficiency in a wafer.

DESCRIPTION OF THE PREFERRED EMBODIMENT

A preferred embodiment of the present invention will be described with reference to the accompanying drawings. In the below embodiment, a substrate cleaning system according to the present invention will be described as applied to a semiconductor wafer cleaning system. However, the present inventions is not limited to the semiconductor wafer cleaning system, and can be applied widely to substrate cleaning systems.

FIGS. 1 to 5 are views showing a substrate cleaning method, a substrate cleaning system, a program, and a storage medium in this embodiment of the present invention.

Figure 1:
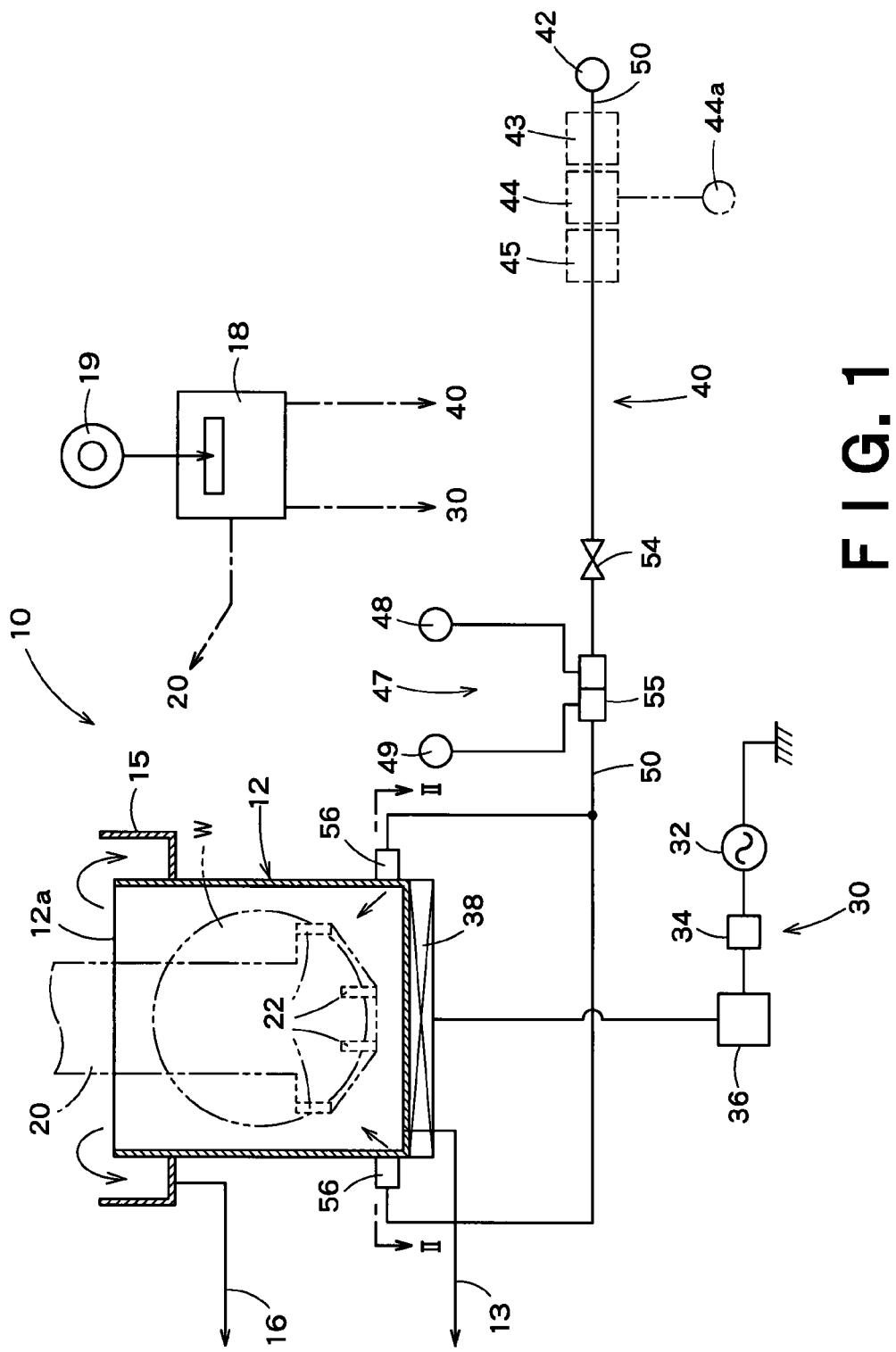
FIG. 1 is a view showing a schematic structure of a substrate cleaning system in one embodiment of the present invention.

FIG. 1 is a view showing a schematic structure of the substrate cleaning system. FIG. 2 is a cross-sectional view taken on the line II-II in FIG. 1. FIG. 3 is a diagram for explaining an operating mode of an ultrasonic generator and a change in a supply rate of a cleaning liquid supplied from a cleaning liquid supply system. FIGS. 4 and 5 are views for explaining a mode of propagation of ultrasonic waves in the cleaning liquid.

Referring to FIG. 1, a substrate cleaning system 10 in this embodiment of the present invention includes: a cleaning tank (DIP tank) 12; a cleaning liquid supply system 40 connected to the cleaning tank 12 so as to supply a cleaning liquid into the cleaning tank 12; a holding member (also referred to as "wafer boat") 20 for holding wafers to be processed (substrates to be processed) W, an ultrasonic generator 30 for generating ultrasonic waves in the cleaning liquid contained in the cleaning tank 12; and a control device 18 connected to the cleaning liquid supply system 40 and the ultrasonic generator 30. The substrate cleaning system 10 immerses wafers to be processed W in the cleaning liquid contained in the cleaning tank 12 and generates ultrasonic waves in the cleaning liquid so as to clean the wafers to be processed W by ultrasonic cleaning.

The cleaning liquid supply system 40 is described in detail at first. As shown in FIG. 1, the cleaning liquid supply system 40 includes: a pump 42 that delivers a cleaning liquid in which a gas, such as an air, preferably an inert gas, and more preferably nitrogen, is dissolved; and a connecting pipe 50 that connects the pump 42 and the cleaning tank 12 to each other. In this embodiment, the pump 42 is connected to a pure water source, not shown, so as to deliver, as a cleaning liquid, a pure water (e.g., deionized water (DIW)) stored in the pure water source into the connecting pipe 50. The pump may be, e.g., an air-driven bellows pump which is capable of adjusting a delivering rate by adjusting an air pressure. As shown in FIG. 1, the connecting pipe 50 is provided with an on-off valve 54, so that the connecting pipe 50 can be opened and/or closed by means of the on-off valve 54.

As shown in FIG. 1, the cleaning liquid supply system 40 also includes a chemical supply unit 47 for supplying a chemical element to a pure water flowing through the connecting pipe 50. The chemical supply unit 47 has: a first mixing valve 55 placed in the connecting pipe 50; and a first chemical source 48 and a second chemical source 49 that are connected to the first mixing valve 55 so as to supply chemical elements thereto. In this embodiment, the first chemical source 48 supplies hydrogen peroxide as a first chemical element, and the second chemical source 49 supplies ammonia as a second chemical element. Thus, by supplying hydrogen peroxide and ammonia from the first chemical source 48 and the second chemical source 49, respectively, into the connecting pipe 50, and mixing the hydrogen peroxide and the ammonia with the pure water in the connecting pipe 50, a chemical solution, namely, an ammonia-hydrogen peroxide solution SC1 ($NH_4OH/H_2O_2/H_2O$) can be supplied into the supply tank 12.

As shown in FIGS. 1 and 2, two cleaning nozzles 56, which extend along opposed wall surfaces of the cleaning tank 12, are connected to ends of the connecting pipe 50 on a side of the cleaning tank 12. The cleaning nozzles 56 are elongated tubular members extending along the wall surfaces of the cleaning tank 12. The tubular member is provided with a number of nozzle holes 56a which are arranged at fixed longitudinal intervals. The positions of the nozzle holes 56a are dependent on the positions of the wafers to be processed W held by the holding member 20, which is described hereinbelow.

As described above, the control device 18 connected to the cleaning liquid supply system 40 controls the cleaning liquid supply system 40. More concretely, the control device 18 starts and stops the pump 42, and controls a delivering rate at which the cleaning liquid is delivered by the pump 42 while it is driven for operation, and a supply of the chemical element from the chemical supply unit 47. When the pump 42 is an air-driven bellows pump, a delivering rate of the air-driven bellows pump, namely, the pump 42 can be controlled by controlling an air pressure applied to the air-driven bellows pump. When the pump 42 is a pumping device other than an air-driven bellows pump, such as an electric pump, a delivering rate of the pump 42 can be controlled by controlling a power supplied to the electric pump.

As shown by the two-dot chain lines in FIG. 1, a deaerator 43, a dissolving device 44, a temperature adjusting device 45, and so on may be placed in the connecting pipe 50 according to need.

The deaerator 43 is a device for removing dissolved gases from the cleaning liquid flowing through the connecting pipe 50. The deaerator 43 may be any suitable one of known membrane deaerators and vacuum deaerators. The relation between the input to the deaerator 68 and the amount of gases corresponding to the input that can be removed from the cleaning liquid, namely, the reduction of the dissolved gas concentration corresponding to the input, is determined beforehand. An input to the deaerator 43 is determined according to a desired amount of gases to be removed on the basis of the thus determined relation and the determined input is supplied to the deaerator 43. Thus, a cleaning liquid in which a gas is dissolved at a desired dissolved gas concentration can be obtained.

The dissolving device 44 connected to a gas source 44a is a device for dissolving a gas supplied from the gas source 44a in the cleaning liquid flowing through the connecting pipe 50. Similar to the deaerator 43, the dissolving device 44 may be any suitable one of various known dissolving devices. The relation between the input to the dissolving device 44 and the amount of gases corresponding to the input that can be dissolved in the cleaning liquid, namely, the increase of the dissolved gas concentration corresponding to the input, is determined beforehand. An input to the dissolving device 44 is determined according to a desired amount of gases to be dissolved on the basis of the thus determined relation and the determined input is supplied to the dissolving device 44. Thus, a cleaning liquid in which a desired gas stored in the gas source 44a is dissolved at a desired dissolved gas concentration can be obtained.

Further, as shown in FIG. 1, it is preferable to dispose both the deaerator 43 and the dissolving device 44 such that the deaerator 43 is positioned on an upstream side of the dissolving device 44. In this case, a cleaning liquid in which only a desired gas such as nitrogen supplied from the gas source 44a is dissolved at a desired dissolved gas concentration can be obtained by making at first the dissolved gas concentration of the cleaning liquid in the connecting pipe 50 be 0% by the deaerator 43, and then adjusting the dissolved gas concentration to the desired one by the dissolving device 44.

The temperature adjusting device 45 heats and/or cools the connecting pipe 50 so as to adjust the temperature of the cleaning liquid flowing through the connecting pipe 50. The temperature adjusting device 45 may be a known heating device or a known cooling device.

The cleaning tank 12 into which the cleaning liquid is supplied by the cleaning liquid supply system 40 is described. As shown in FIGS. 1 and 2, the cleaning tank 12 has an a shape substantially resembling a rectangular solid. The cleaning tank 12 has an open upper end through which wafers W are carried into and carried out of the cleaning tank 12, which will be described hereinafter. A drain pipe 13 is connected to a bottom wall of the cleaning tank 12 so as to drain the cleaning liquid from the cleaning tank 12.

As shown in FIG. 1, an outer tank (recovery tank) 15 surrounds the open upper end of the cleaning tank 12. The cleaning liquid overflowing from the cleaning tank 12 through the open upper end is received in the outer tank 15. Similar to the cleaning tank 12, a drain pipe 16 is connected to the outer tank 15 so as to drain the cleaning liquid from the outer tank 15.

The cleaning tank 12 and the outer tank 15 are made of a material having a high chemical resistance, such as quartz or the like. The cleaning liquid drained through the drain pipes 13 and 16 of the respective cleaning tanks 12 and the outer tank 15 may be discarded, or resupplied into the cleaning tank 12 through a filter or the like.

The holding member 20 for holding the wafers W is described. Referring to FIGS. 1 and 2, the holding member 20 has four support bars 22 extending substantially along a horizontal direction, and a base 24 holding the four support bars 22 in a cantilever fashion. A plurality of wafers W, which are to be cleaned at the same time, namely, a batch formed of, e.g., fifty wafers W is supported on the support bars 22 from below. The support bars 22 are provided with grooves, not shown, longitudinally arranged at fixed intervals. The surfaces of the wafers W engaged in the grooves of the support bars 22 are substantially perpendicular to a direction in which the support bars 22 are extended. That is to say, the wafers W are supported on the holding member 20 with the surfaces thereof extended vertically as shown in FIG. 1.

As obvious from FIG. 2, pitches of the nozzle holes 56a of the cleaning nozzles 56 are substantially equal to pitches of the wafers W supported on the holding member 20. The nozzle holes 56a of the cleaning nozzles 56 are arranged so as to supply the cleaning liquid into spaces between the adjacent wafers W held by the holding member 20.

The base 24 of the holding member 20 is connected to a lifting mechanism, not shown. The lifting mechanism lowers the holding member 20 supporting the wafers W so as to immerse the wafers W in the cleaning liquid contained in the cleaning tank 12. The lifting mechanism is connected to the control device 18. Thus, the control device 18 controls the lifting mechanism so as to immerse the wafers W in the cleaning liquid.

The ultrasonic generator 30 is described. As shown in FIG. 1, the ultrasonic generator 30 includes: vibrating members 38 attached to the outer surface of the bottom wall of the cleaning tank 12; a high-frequency power source 32 for driving the vibrating members 38; and an ultrasonic oscillator 34 connected to the high-frequency power source 32. In this embodiment, each of the vibrating members 38 covers a part of the outer surface of the bottom wall of the cleaning tank 12. As shown in FIG. 1, the ultrasonic generator 30 further includes a driving mode selector 36 connected to the ultrasonic oscillator 34 and the vibrating members 38. The driving mode selector 36 selects a total driving mode in which all the vibrating members 38 are driven for ultrasonic wave generation, or a partial driving mode in which one or some of the vibrating members 38 are driven individually for ultrasonic wave generation.

The vibrating members 38 are driven for vibration. Then, ultrasonic waves are transmitted through the bottom wall of the cleaning tank 12 to the cleaning liquid contained therein. Thus, the ultrasonic waves are propagated in the cleaning liquid contained in the cleaning tank 12. The ultrasonic generator 30 is connected to the control device 18. Thus, the control device 18 controls the radiation (application) of the ultrasonic waves to the cleaning liquid.

The control device 18 is described. As mentioned above, the control device 18 is connected to the components of the substrate cleaning system 10 so as to control operations of these components. In this embodiment, the control device 18 includes a computer. The computer executes a program stored beforehand in a storage medium 19 so as to accomplish a wafer cleaning method by the substrate cleaning system 10.

A cleaning method for a wafer W to be carried out by the substrate cleaning system 10 as structured above will be described by way of example with reference to FIGS. 3 to 5.

In accordance with signals provided by the control device 18, the pump 42 is driven for delivering a pure water as a cleaning liquid into the connecting pipe 50. Meanwhile, the first chemical source 48 and the second chemical source 49 of the chemical supply unit 47 supply hydrogen peroxide and ammonia, respectively, into the connecting pipe 50. Thus, a chemical solution SC1 as a cleaning liquid of, e.g., 25° C. is supplied into the cleaning tank 12 through the cleaning nozzles 56 of the chemical liquid supply system 40.

In this supplying step, the control device 18 controls the cleaning liquid supply system 40 according to a predetermined program such that a supply rate at which the cleaning liquid is supplied into the cleaning tank 12 is maintained constant at, e.g., a predetermined rate A (l/min) as shown in FIG. 3, for example. The control device 18 controls supply rates of the chemical elements supplied from the respective chemical sources 48 and 49 into the connecting pipe 50 based on the supply rate of the cleaning liquid (pure water) flowing through the connecting pipe 50.

When the deaerator 43 and the dissolving device 44 are placed in the connecting pipe 50 as shown by the two-dot chain lines in FIG. 1, the control device 18 controls the deaerator 43 and the dissolving device 44 according to a predetermined program such that a dissolved gas concentration of the cleaning liquid supplied from the cleaning liquid supply system 40 into the cleaning tank 12 takes a predetermined value.

According to the above steps, the cleaning tank 12 is filled with the cleaning liquid (SC1) after a time point a shown in FIG. 3.

The control device 18 drives the lifting mechanism, not shown, connected to the wafer holding member 20 holding, for example, fifty wafers W so as to move the wafer holding member 20 downward and so as to immerse the wafers W in the cleaning liquid contained in the cleaning tank 12.

Then, the control device 18 actuates the ultrasonic generator 30 so as to generate ultrasonic waves in the cleaning liquid contained in the cleaning tank 12. Thus, the wafers W immersed in the cleaning liquid contained in the cleaning tank 12 are subjected to an ultrasonic cleaning process (megasonic process) so as to remove particles (foreign matters) adhering to the surfaces of the wafers W.

In this embodiment, as shown in FIG. 3, the cleaning liquid (chemical liquid) is continuously supplied (replenished) from the connecting pipe 50 of the cleaning liquid supply system 40 into the cleaning tank 12 such that the cleaning liquid is partially replaced with the replenished cleaning liquid. However, in this cleaning step, the control device 18 controls the cleaning liquid supply system 40 according to a predetermined program such that a supply rate at which the cleaning liquid is supplied into the cleaning tank 12 is maintained constant at, e.g., a predetermined rate B (l/min) as shown in FIG. 3. As shown in FIGS. 1 and 2, the cleaning liquid is jetted diagonally upward toward a space between the adjacent two wafers held by the holding member 20. By keeping the supply of the cleaning liquid into the cleaning tank 12, the cleaning liquid overflows from the cleaning tank 12. The cleaning liquid overflowing from the cleaning tank 12 is received in the outer tank 15.

The above-described first ultrasonic cleaning step in which ultrasonic waves are generated in the cleaning liquid contained in the cleaning tank 12 while the cleaning liquid is being supplied by the cleaning liquid supply system 40 continues for 5 minutes, for example, which is the term between the time point a and the time point b shown in FIG. 3.

Thereafter, in this embodiment, while the radiation of ultrasonic waves by the ultrasonic generator 30 is continued, the supply of the cleaning liquid by the cleaning liquid supply system 40 is stopped. This second ultrasonic cleaning step, in which ultrasonic waves are generated by the ultrasonic generator 30 in the cleaning liquid contained in the cleaning tank 12 while the supply of the cleaning liquid by the cleaning liquid supply system 40 is suspended, continues for 5 minutes, for example, which is the term between the time point b and the time point c shown in FIG. 3.

That is to say, the substrate cleaning method in this embodiment includes the first ultrasonic cleaning step in which the ultrasonic cleaning is conducted while the cleaning liquid is being replenished into the cleaning tank 12, and the second ultrasonic cleaning step in which the ultrasonic cleaning is conducted while the replenishment of the cleaning liquid into the cleaning tank 12 is suspended. As apparent from the examples hereinbelow, a position of an area where particles are easily removed changes in the wafer W, depending on the supply of the cleaning liquid or lack thereof into the cleaning tank during when the ultrasonic waves are generated in the cleaning liquid contained in the cleaning tank. In other words, according to this embodiment, it is possible to clean, in the second ultrasonic cleaning step, a portion of the wafer from which particles are difficult to be removed in the first ultrasonic cleaning step. As a result, particles can be more uniformly removed from the wafer W, and a particle removing efficiency can be improved in the wafer W from the overall point of view.

Although a mechanism of this phenomenon is not clearly known, a mechanism that can be one of the factors will be described with reference to FIGS. 4 and 5. However, the present invention is not limited to the mechanism described below.

In ultrasonic cleaning, ultrasonic waves propagated in the cleaning liquid generate pressure vibrations in the cleaning liquid. Gas molecules contained in the cleaning liquid are ruptured by the pressure variation (pressure vibrations). The rupture of the gas molecules generates shock waves (cavitation). It is inferred that the generation of the shock waves (cavitation) is one of major factors that peels (removes) particles from the wafers W. Thus, it is assumed that the higher the dissolved gas concentration of the cleaning liquid, the higher the intensity of the shock waves generated in regions in which ultrasonic waves are propagated and that the shock waves of a high intensity can remove particles from the wafers W at a high removing efficiency. On the other hand, as mentioned in JP10-109072A, it is thought that, when the dissolved gas concentration of the cleaning liquid is high, the gas dissolved in the cleaning liquid absorbs the ultrasonic waves, which may interfere with pervasion of the ultrasonic waves throughout the cleaning tank 12.

Gas molecules dissolved in the cleaning liquid tend to gather in regions where negative pressures are produced by ultrasonic waves. Thus, bubbles are produced in these regions, and these bubbles gradually grow large and eventually rise to the surface of the cleaning liquid. Therefore, it is assumed that the dissolved gas concentration of the cleaning liquid decreases if ultrasonic waves are continuously generated without supplying (replenishing) a new cleaning liquid into the cleaning tank 12. The production and growth of bubbles are promoted particularly in a lower part of the cleaning liquid contained in the cleaning tank 12 where intense pressure vibrations occur and from which bubbles start moving. As a result, the dissolved gas concentration of the cleaning liquid decreases from the lower part in the cleaning tank. On the other hand, since the outside air can be dissolved in the cleaning liquid near the surface thereof, the dissolved gas concentration in the upper part of the cleaning tank 12 is resistant to decrease, or rather may be maintained near at a saturated concentration.

In view of the above, it is assumed that, as shown in FIG. 4, in the first ultrasonic cleaning step in which the ultrasonic cleaning is conducted while the cleaning liquid is being replenished into the cleaning tank 12, it is expected that particles on a lower area of the wafer W can be removed at a high removing efficiency, since the lower area of the wafer W is exposed to the lower part of the cleaning liquid where the pressure largely varies. It is also assumed that, a particle removing efficiency is degraded in areas of the wafer positioned above the support bars 22 which interfere with the ultrasonic waves radiated from below.

On the other hand, in the second ultrasonic cleaning step in which the ultrasonic cleaning is conducted while the replenishment of the cleaning liquid into the cleaning tank 12 is suspended, it is assumed that the dissolved gas concentration of the cleaning liquid in the lower part of the cleaning tank 12 decreases as time passes. Meanwhile, it is assumed that the dissolved gas concentration of the cleaning liquid in the upper part of the cleaning tank 12 is maintained higher than at least the dissolved gas concentration of the cleaning liquid in the lower part of the cleaning tank 12. As a result, as shown in FIG. 5, it is assumed that ultrasonic waves are propagated up to the surface of the cleaning liquid without being greatly absorbed by the dissolved gas in the lower part of the cleaning tank 12, and then reflected by the surface so as to be diffused in the cleaning tank 12. Thus, it is expected that particles on the upper area of the wafer W can be removed at a high removing efficiency, since the dissolved gas concentration of the cleaning liquid in the upper part of the cleaning tank 12 can be maintained relatively high.

In short, according to this embodiment, since the first ultrasonic cleaning step in which the ultrasonic cleaning is conducted while the cleaning liquid is being replenished into the cleaning tank 12 is carried out at first, and then the second ultrasonic cleaning step in which the ultrasonic cleaning is conducted while the replenishment of the cleaning liquid into the cleaning tank 12 is suspended is carried out. Thus, in the first ultrasonic cleaning step, particles on the lower area in the wafer W can be mainly removed at a high removing efficiency. Then, in the second ultrasonic cleaning step, particles on the upper area in the wafer W can be mainly removed at a high removing efficiency. Thus, particles can be relatively uniformly removed from the entire surface of the wafer W, and particles can be removed from the wafer W at relatively a high removing efficiency.

At the time point c shown in FIG. 3, the control device 18 provides signals to stop the radiation of ultrasonic waves by the ultrasonic generator 30 so as to finish the second ultrasonic cleaning step in which the ultrasonic cleaning is conducted while the replenishment of the cleaning liquid into the cleaning tank 12 is suspended.

After the second ultrasonic cleaning step is finished, there succeeds a rinsing step for rinsing off the chemical solution as a cleaning liquid from the wafer. Specifically, the cleaning liquid (chemical solution) in the cleaning tank 12 and the cleaning liquid (chemical solution) in the outer tank 15 are drained through the respective drain pipes 13 and 16. As described above, the drained cleaning liquid may be discarded or collected for reuse. Then, a cleaning liquid is supplied again from the connecting pipe 50. Note that, in this step, no chemical element is supplied from the first chemical source 48 and the second chemical source 49 of the chemical supply unit 47 into the connecting pipe 50. Thus, the cleaning liquid supplied into the cleaning tank 12 is a pure water.

In this rinsing step, after the cleaning tank 12 is filled with the cleaning liquid (pure water) as described above, the cleaning liquid (pure water) is still supplied from the connecting pipe 50. The cleaning liquid (pure water) overflows from the open upper end of the cleaning tank 12, and the cleaning liquid (pure water) that overflowed is received in the outer tank 15. The rinsing step of the wafers W is thus performed. The cleaning liquid (pure water) received in the outer tank 15 may be discarded or reused.

When the rinsing step of the wafers W is finished, the holding member 20 moves upward so as to unload the wafers from the cleaning tank 12. Thus, a series of cleaning steps for cleaning the wafers W is completed.

In the above-described embodiment, the first ultrasonic cleaning step in which the ultrasonic cleaning is conducted while the cleaning liquid is being replenished into the cleaning tank 12 so as to replace the cleaning liquid contained in the cleaning tank 12 with new one is performed at first, and then the second ultrasonic cleaning step in which the ultrasonic cleaning is conducted while the replenishment of the cleaning liquid into the cleaning tank 12 is suspended is performed. That is to say, the wafer W is subjected to the ultrasonic cleaning process in which the dissolved gas concentration distribution of the cleaning liquid in contact with the surface of the wafer W differs between the first ultrasonic cleaning step and the second ultrasonic cleaning step. With this variation in the dissolved gas concentration distribution of the cleaning liquid in contact with the surface of the wafer W, a position of an area where particles are easily removed changes in the wafer W. Thus, it is possible to more uniformly remove particles from the wafer W. Further, the particle removing efficiency in the wafer W can be enhanced on the whole. In addition, this cleaning method can be realized by changing the control method of the existing substrate cleaning system 10. Therefore, costs required for the system capable of realizing this cleaning method can be reduced, which leads to a reduction in costs required for cleaning the wafer W.

The above embodiment can be modified in various ways within the scope of the present invention. Modifications of the present invention will be described below by way of example.

In the foregoing embodiment, the ultrasonic cleaning is conducted while the cleaning liquid is being replenished into the cleaning tank 12, and then the ultrasonic cleaning is conducted while the replenishment of the cleaning liquid into the cleaning tank 12 is suspended. However, the present invention is not limited thereto. As a modification, it is possible to conduct the ultrasonic cleaning while the replenishment of the cleaning liquid into the cleaning tank 12 is suspended, and then conduct the ultrasonic cleaning while the cleaning liquid is being replenished into the cleaning tank 12. Namely, the order of the first ultrasonic cleaning step and the second ultrasonic cleaning step in the above-described embodiment may be reversed.

Figure 6:
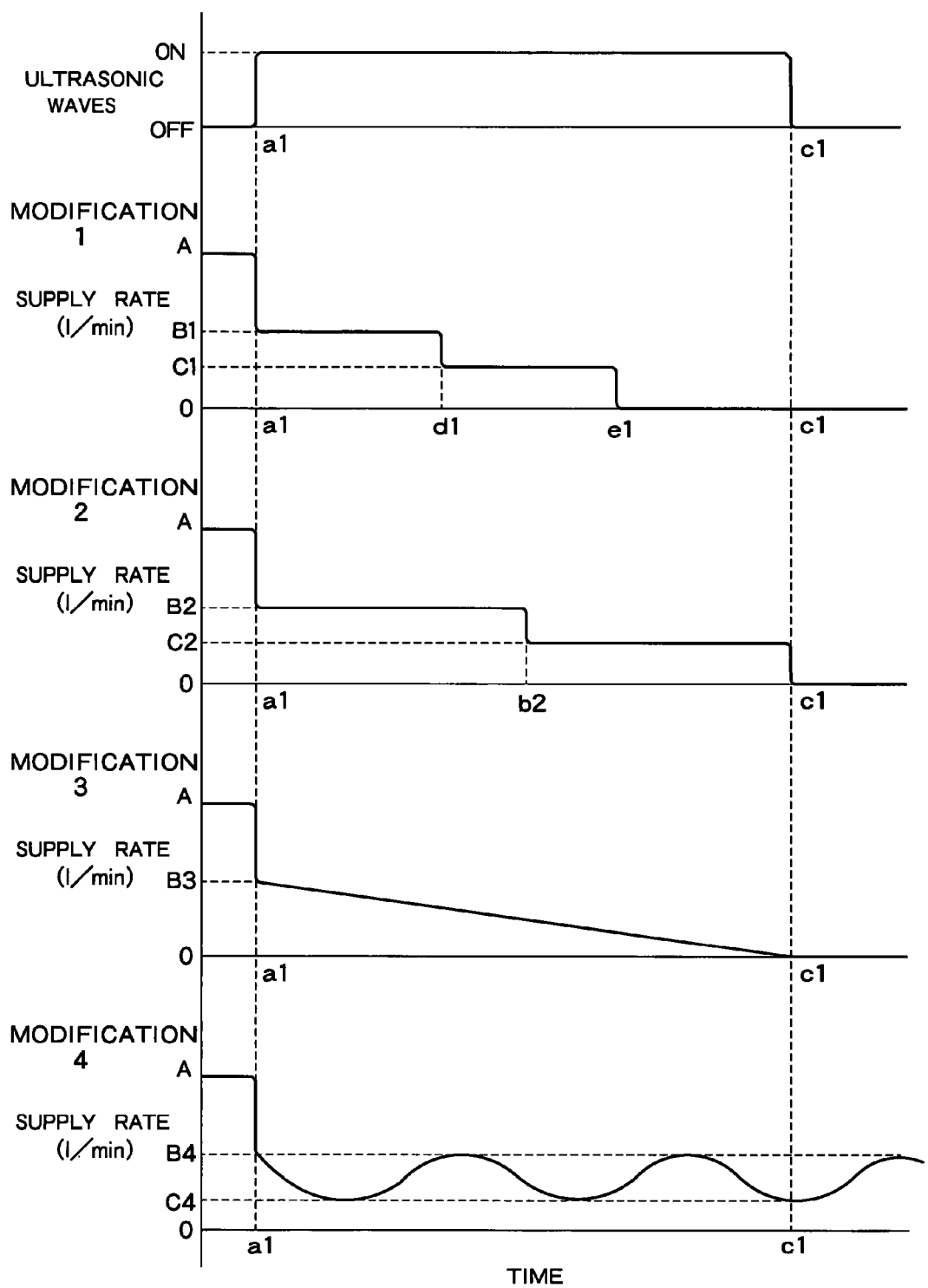
FIG. 6 is a diagram corresponding to FIG. 3, for explaining an alternative example of a change in a supply rate at which the cleaning liquid is supplied from the cleaning liquid supply system in connection with an operating mode of the ultrasonic generator.

In view of the fact that a position of an area where particles are easily removed changes in the wafer W depending on the supply of the cleaning liquid or lack thereof into the cleaning tank 12 during the ultrasonic cleaning, as well as the above-described assumed mechanism and the below-described experiment results compatible with this mechanism, it can be understood that a position of an area where particles are easily removed changes in a substrate, depending not only on the supply of the cleaning liquid or lack thereof, but also on the increase or decrease in a supply rate at which the cleaning liquid is supplied into the cleaning tank 12 during the ultrasonic cleaning. Various modifications are possible based on this understanding. FIG. 6 shows such modifications by way of example. FIG. 6 is a diagram corresponding to FIG. 3, for explaining a change in a supply rate at which the cleaning liquid is supplied from the cleaning liquid supply system 40 in relation to an operating mode of the ultrasonic generator 30.

In Modification 1 shown in FIG. 6, a supply rate at which the cleaning liquid is supplied from the cleaning liquid supply system 40 into the cleaning tank 12 is maintained at a supply rate B1 (l/min) between the time point a1 and the time point d1, and is then maintained at a supply rate C1 (l/min) between the time point d1 and the time point e1. Thereafter, the supply of the cleaning liquid is stopped. Namely, in Modification 1, the supply rate at which the cleaning liquid is supplied into the cleaning tank 12 is changed twice in a stepwise manner, i.e., from the first stage to the second stage and then from the second stage to the third stage, during when ultrasonic waves are generated in the cleaning liquid contained in the cleaning tank 12.

In Modification 2 shown in FIG. 6, a supply rate at which the cleaning is supplied from the cleaning liquid supply system 40 into the cleaning tank 12 is maintained at a supply rate B2 (l/min) between the time point a1 and the time point b2, and is then maintained at a supply rate C2 (l/min) between the time point b2 and the time point c1. Namely, in Modification 2, the cleaning liquid is continuously supplied into the cleaning tank 12, during when ultrasonic waves are generated in the cleaning liquid contained in the cleaning tank 12. The supply rate at which the cleaning liquid is supplied into the cleaning tank 12 is changed in the course of the ultrasonic cleaning.

In Modification 3 shown in FIG. 6, at the time point a1, the ultrasonic generator 30 starts, and simultaneously the cleaning liquid supply system 40 supplies the cleaning liquid into the cleaning tank 12 at a supply rate B3 (l/min). Then, the supply rate at which the cleaning liquid is supplied into the cleaning tank 12 is gradually decreased in a stepless manner as time passes. At the time point c1, the ultrasonic generator 30 stops, and simultaneously the supply of the cleaning liquid into the cleaning tank 12 is stopped.

In Modification 4 shown in FIG. 6, between the time point a1 and the time point c1 in which the ultrasonic generator 30 is in operation, the cleaning liquid supply system 40 continues to supply the cleaning liquid into the cleaning tank 12. In Modification 4, a supply rate at which the cleaning liquid is supplied into the cleaning tank 12 is changed as time passes between not more than a supply rate B4 (l/min) and not less than a supply rate C4 (l/min).

As can be seen from Modifications 1 to 4 shown in FIG. 6, the cleaning liquid supply system 40 may continue to supply the cleaning liquid into the cleaning tank 12 during the operation of the ultrasonic generator 30 (Modifications 2 to 4), or the cleaning liquid supply system 40 may suspend the supply of the cleaning liquid into the cleaning tank 12 for a certain period of time during the operation of the ultrasonic generator 30 (Modification 1). Further, a supply rate at which the cleaning liquid is supplied by the cleaning liquid supply system 40 into the cleaning tank 12 may either be changed in a stepwise manner (Modification 1 and Modification 2) or stepless manner (Modification 3 and Modification 4). Furthermore, the stepwise manner and the stepless manner may be suitably combined. In the stepwise manner, a supply rate at which the cleaning liquid is supplied may be changed twice or more times. In addition, the step in which the ultrasonic cleaning is conducted while the cleaning liquid is being supplied, and the step in which the ultrasonic cleaning is conducted while the supply of the cleaning liquid into the cleaning tank is suspended may be repeated.

In the foregoing embodiment, a supply rate at which the cleaning liquid is supplied by the cleaning liquid supply system 40 into the cleaning tank 12 is changed by changing a delivering rate of the pump 42. However, the present invention is not limited thereto, and various known methods can be adopted. For example, a supply rate may be changed by changing an opening degree of a valve placed in the connecting pipe 50.

In the foregoing embodiment, SC1 is used as a cleaning liquid for the ultrasonic cleaning of the wafers W. However, not limited thereto, the wafers W may be cleaned by the ultrasonic cleaning process using a chemical solution other than SC1. For example, the wafers W may be cleaned by the ultrasonic cleaning process using a pure water as a cleaning liquid. When the wafers W are cleaned by the ultrasonic cleaning process using a pure water as a cleaning liquid, the rinsing process can be omitted.

In the foregoing embodiment, the ultrasonic generator 30 is stopped so as not to generate ultrasonic waves in the pure water (cleaning liquid) during the rising process for rinsing off the chemical solution (cleaning liquid) with a pure water (cleaning liquid). However, not limited thereto, it is possible to generate ultrasonic waves in the cleaning liquid (pure water) contained in the cleaning tank 12 by means of the ultrasonic generator 30 during the rinsing process for rinsing off the chemical solution (cleaning liquid), so that a rinsing effect of the rinsing process can be enhanced and particles (foreign matters) still remaining on the wafer W can be further removed. In this case, it is possible to rinse relatively uniformly the entire surfaces of the wafers W at relatively a high rinsing efficiency, and to remove relatively uniformly particles from the entire surfaces of the wafer W at relatively a high removing efficiency, by supplying or not supplying the cleaning liquid into the cleaning tank, or by changing a supply rate at which the cleaning liquid is supplied into the cleaning tank, while ultrasonic waves are generated in the cleaning liquid contained in the cleaning tank 12.

Some possible modifications have been described with respect to the above embodiment. Naturally, these modifications can be suitably combined with each other.

The substrate cleaning system 10 has the control device 18 including the computer. The control device 18 controls operations of the components of the substrate cleaning system 10 so as to clean the wafer to be processed W. The present invention provides a program to be executed by the computer of the control device 18 so as to accomplish the wafer cleaning process, and the computer-readable storage medium 19 storing this program. The storage medium 19 may include a flexible disk, a hard disk, or the like.

Although the substrate cleaning methods, the substrate cleaning systems, the program, and the storage medium according to the present invention have been described as applied to cleaning the wafer W, the present invention is not limited thereto. For example, the present invention is applicable to cleaning LCD substrates, CD substrates, and the like.

EXAMPLES

In order to provide a more detailed explanation of the present invention in terms of the examples, two experiments were performed.

EXPERIMENT 1

After cleaning liquid was supplied into the cleaning tank, a test wafer was immersed in the cleaning liquid contained in the cleaning tank, and ultrasonic waves were generated in the cleaning liquid. The experiment was performed under two conditions. Namely, in one cleaning condition, ultrasonic waves were generated in the cleaning liquid contained in the cleaning tank with the cleaning liquid being continuously supplied (replenished) into the cleaning tank, and in the other cleaning condition, ultrasonic waves were generated in the cleaning liquid contained in the cleaning tank with no cleaning liquid being supplied (replenished) into the cleaning tank.

The cleaning liquid for use in this experiment contained nitrogen and oxygen dissolved therein at the respective saturated concentrations. The temperature of the cleaning liquid was 25° C. Except for these parameters, general parameters for an ultrasonic cleaning process for processing wafers were employed. For example, a time period for generating ultrasonic waves was 10 minutes. 4,000 particles had been uniformly adhered in advance to each test wafer used in this experiment. There was used in this experiment a cleaning tank, as shown in FIGS. 1 and 2, which can receive a plurality of wafers and is provided with cleaning nozzles disposed on lower side parts of the tank for supplying cleaning liquids.

Experiment results are shown in Table 1 and FIG. 7. Table 1 shows particle removing efficiencies (=(the number of particles remaining on the test wafer after the ultrasonic cleaning)/4,000×100 (%)) for a case in which the cleaning liquid was supplied (replenished) into the cleaning tank during when ultrasonic waves were generated in the cleaning liquid contained in the cleaning tank, and for a case in which no cleaning liquid was supplied (replenished) into the cleaning tank is suspended during when ultrasonic waves were generated in the cleaning liquid contained in the cleaning tank. After the ultrasonic cleaning process, where the particles on the test wafers had been removed at a high removing efficiency was observed. FIG. 7 shows the results. In FIG. 7, the shaded portions depict areas which are observed that the particles were removed at high removing efficiency. The arrangement of each test wafer in the plane of FIG. 7 corresponds to the arrangement of the test wafer in the cleaning tank. Namely, a lower part of the test wafer in the plane of FIG. 7 was oriented downward in the cleaning tank (near the vibrating members of the ultrasonic generator) during the ultrasonic cleaning.

TABLE 1

Experiment Results of Experiment 1

|  | Supply of Cleaning Liquid during Ultrasonic Cleaning | |
|---|---|---|
|  | Supplied | Not Supplied |
| Particle Removing Efficiency (%) | 61.4 | 58.0 |

As understood from FIG. 7, in the case where the ultrasonic cleaning was conducted with the cleaning liquid being replenished, the lower area of the test wafer, i.e., the area near the vibrating members of the ultrasonic generator, was cleaned at a high particle removing efficiency. In the case where the ultrasonic cleaning was conducted with the cleaning liquid being replenished, the area of the test wafer positioned above the bar members of the holding member had a degraded particle removing efficiency.

On the other hand, as understood from FIG. 7, in the case where the ultrasonic cleaning was conducted with no cleaning liquid being replenished, the upper area of the test wafer was cleaned at a high particle removing efficiency.

EXPERIMENT 2

The following experiment was performed as an example of the present invention. As shown in FIG. 3, a test wafer was subjected to the ultrasonic cleaning process for 5 minutes, while the cleaning liquid was being replenished. Following thereto, the test wafer was subjected to the ultrasonic cleaning process for 5 minutes, while the replenishment of the cleaning liquid was stopped for 5 minutes. The rest parameters for the ultrasonic cleaning process were the same as those in Experiment 1. Similar to Experiment 1, there was used a test wafer to which 4,000 particles had been uniformly adhered in advance.

The experiment result are shown in Table 2. Comparative Example 1 in Table 1 is a particle removing efficiency of Experiment 1 in which the ultrasonic cleaning was conducted for 10 minutes with the cleaning liquid being continuously replenished. Comparative Example 2 in Table 1 is a particle removing efficiency of Experiment 1 in which the ultrasonic cleaning was conducted for 10 minutes with no cleaning liquid being replenished.

TABLE 2

Experiment Result of Experiment 2

|  | Example | Comparative Example 1 | Comparative Example 2 |
|---|---|---|---|
| Supply of Cleaning Liquid during Ultrasonic Cleaning | supplied → not supplied | supplied | not supplied |
| Particle Removing Efficiency (%) | 71.4 | 61.4 | 58.0 |

As shown in Table 2, the wafer, which was subjected to the ultrasonic cleaning process under the condition of Experiment 2, was cleaned at the highest particle removing ratio. The surface of the test wafer which had been cleaned under the condition of Experiment 2 was observed, and it was found that the particles were uniformly removed therefrom.

The invention claimed is:

1. A substrate cleaning system comprising:
    a cleaning tank that contains a cleaning liquid and accommodates a semiconductor wafer in an upstanding position therein;
    an ultrasonic generator that generates ultrasonic waves in the cleaning liquid contained in the cleaning tank from below the upstanding semiconductor wafer;
    a cleaning liquid supply system that supplies the cleaning liquid whose dissolved gas concentration is adjusted to a desired concentration into the cleaning tank; and
    a control device configured to control the cleaning liquid supply system and the ultrasonic generator such that:
    the control device causes the cleaning liquid supply system to supply the cleaning liquid into the cleaning tank at a first supply rate in order to fill the tank and adjust a dissolved gas concentration in the liquid to a predetermined value before a semiconductor wafer is immersed in the cleaning liquid within the tank,
    after the semiconductor wafer is immersed in the tank and maintained in the upstanding position, the control device causes the ultrasonic wave generator to begin generating ultrasonic waves in the cleaning liquid while causing the cleaning liquid supply system to reduce, in a stepwise or stepless manner, the supply rate of the cleaning liquid from the first supply rate to a second supply rate that is less than the first supply rate and greater than zero;
    thereafter, the control device causes the ultrasonic wave generator to continue generation of ultrasonic waves in the cleaning liquid while causing the cleaning liquid supply system to continue supply of the cleaning liquid at the second supply rate so that cleaning liquid overflows from the tank through an open upper end of the tank; and
    thereafter, the control device causes the ultrasonic wave generator to continue generation of ultrasonic waves in the cleaning liquid while causing the cleaning liquid supply system to reduce, in a stepwise or stepless manner, the supply rate of cleaning liquid from the second supply rate to a third supply rate that is less than the second supply rate.

2. The substrate cleaning system according to claim 1, wherein the third supply rate is zero.

3. A substrate cleaning method comprising the steps of:
    supplying a cleaning liquid into a cleaning tank at a first supply rate in order to fill the tank while adjusting a dissolved gas concentration in the liquid to a predetermined value;
    thereafter, immersing a semiconductor wafer in the cleaning liquid within the tank and maintaining the wafer upstanding within the tank through said method;
    thereafter, beginning generating ultrasonic waves in the cleaning liquid in the tank from below the wafer while reducing, in a stepwise or stepless manner, the supply rate of the cleaning liquid from the first supply rate to a second supply rate that is less than the first supply rate and greater than zero;
    thereafter, continuing generation of ultrasonic waves in the cleaning liquid while continuing supply of the cleaning liquid at the second supply rate so that cleaning liquid overflows from the tank through an open upper end of the tank; and
    thereafter, while continuing generation of ultrasonic waves in the cleaning liquid, reducing, in a stepwise or stepless manner, the supply rate of cleaning liquid from the second supply rate to a third supply rate that is less than the second supply rate.

4. The substrate cleaning method according to claim 3, wherein the third supply rate is zero.

5. A non-transitory storage medium storing a program executed by a control device for controlling a substrate cleaning system so as to accomplish the substrate cleaning method according to claim 3.

6. A non-transitory storage medium storing a program executed by a control device for controlling a substrate cleaning system so as to accomplish the substrate cleaning method according to claim 4.

* * * * *